United States Patent
Salewske et al.

(10) Patent No.: US 8,665,102 B2
(45) Date of Patent: Mar. 4, 2014

(54) TRANSCEIVER INTERFACE FOR POWER SYSTEM MONITORING

(75) Inventors: Tyson J. Salewske, Vernon Hills, IL (US); Laurence V. Feight, Island Lake, IL (US)

(73) Assignee: Schweitzer Engineering Laboratories Inc, Pullman, WA (US)

( * ) Notice: Subject to any disclaimer, the term of this patent is extended or adjusted under 35 U.S.C. 154(b) by 1268 days.

(21) Appl. No.: 12/175,584

(22) Filed: Jul. 18, 2008

(65) Prior Publication Data

US 2010/0013632 A1    Jan. 21, 2010

(51) Int. Cl.
G08B 21/00    (2006.01)

(52) U.S. Cl.
USPC .......................... 340/657; 324/522; 700/286

(58) Field of Classification Search
CPC ..................................................... G01R 19/145
USPC ........... 340/657, 815, 531, 6.35, 3.43, 825.72
See application file for complete search history.

(56) References Cited

U.S. PATENT DOCUMENTS

| | | | |
|---|---|---|---|
| 2,379,664 A | 7/1945 | Stanko | |
| 2,928,048 A | 3/1960 | Postal | |
| 2,967,267 A | 1/1961 | Steinman | |
| 3,292,579 A | 12/1966 | Buchanan | |
| 3,296,493 A | 1/1967 | Whittaker | |
| 3,476,997 A | 11/1969 | Otzipka | |
| 3,525,903 A | 8/1970 | Morris | |
| 3,621,334 A | 11/1971 | Burns | |
| 3,676,740 A | 7/1972 | Schweitzer | |
| 3,702,966 A | 11/1972 | Schweitzer | |
| 3,706,930 A * | 12/1972 | Harner | 340/538.11 |
| 3,708,724 A | 1/1973 | Schweitzer | |
| 3,715,742 A | 2/1973 | Schweitzer | |
| 3,781,682 A | 12/1973 | Schweitzer | |
| 3,816,816 A | 6/1974 | Schweitzer | |
| 3,866,197 A | 2/1975 | Schweitzer | |
| 3,876,911 A | 4/1975 | Schweitzer | |
| 3,906,477 A | 9/1975 | Schweitzer | |
| 3,972,581 A | 8/1976 | Oldham | |
| 3,974,446 A | 8/1976 | Schweitzer | |
| 4,029,951 A | 6/1977 | Berry | |

(Continued)

OTHER PUBLICATIONS

Cooper Industries, Ltd., GridAdvisor, OutageAdvisor Fault Detection and Location Solution, Cellular Communications, Cooper Power Systems, 2008.

(Continued)

*Primary Examiner* — Jennifer Mehmood
*Assistant Examiner* — Rufus Point
(74) *Attorney, Agent, or Firm* — Richard M. Edge (57) ABSTRACT

A system and method for filtering electric power system data communicated from faulted circuit indicators (FCIs) and at least one other source before the electric power system data is further communicated to a monitoring system such as SCADA. The power system data from the FCIs may include an event such as a fault on the electric power system. To avoid sending incorrect or excess information along to the monitoring system, the present disclosure describes a system and method for comparing data from the FCIs against electric power system data gathered either directly from the electric power system or from an intelligent electronic device (IED). If the two sets of data agree, then the information is passed on to the monitoring system. The FCIs may communicate to a transceiver interface periodically, upon detection of an event, and/or upon interrogation by the transceiver interface.

43 Claims, 7 Drawing Sheets

(56) References Cited

U.S. PATENT DOCUMENTS

| | | | |
|---|---|---|---|
| 4,034,360 A | 7/1977 | Schweitzer | |
| 4,038,625 A | 7/1977 | Tompkins | |
| 4,045,726 A | 8/1977 | Schweitzer | |
| 4,063,171 A | 12/1977 | Schweitzer | |
| 4,086,529 A | 4/1978 | Schweitzer | |
| 4,112,292 A | 9/1978 | Varvel | |
| 4,144,485 A | 3/1979 | Akita | |
| 4,165,528 A | 8/1979 | Schweitzer | |
| 4,186,986 A | 2/1980 | Shoemaker | |
| 4,199,741 A | 4/1980 | Serrus Paulet | |
| 4,234,847 A | 11/1980 | Schweitzer | |
| 4,251,770 A | 2/1981 | Schweitzer | |
| 4,288,743 A | 9/1981 | Schweitzer | |
| 4,375,617 A | 3/1983 | Schweitzer | |
| 4,414,543 A | 11/1983 | Schweitzer | |
| 4,424,512 A | 1/1984 | Schweitzer | |
| 4,438,403 A | 3/1984 | Schweitzer | |
| 4,456,873 A | 6/1984 | Schweitzer | |
| 4,458,198 A | 7/1984 | Schweitzer | |
| 4,495,489 A | 1/1985 | Schweitzer | |
| 4,536,758 A | 8/1985 | Schweitzer | |
| 4,599,487 A | 7/1986 | Blank | |
| 4,686,518 A | 8/1987 | Schweitzer | |
| 4,689,752 A * | 8/1987 | Fernandes et al. | 700/292 |
| 4,709,339 A * | 11/1987 | Fernandes | 700/293 |
| 4,794,328 A * | 12/1988 | Fernandes et al. | 324/127 |
| 4,794,329 A | 12/1988 | Schweitzer | |
| 4,794,332 A | 12/1988 | Schweitzer | |
| 4,795,982 A | 1/1989 | Schweitzer | |
| 4,829,298 A | 5/1989 | Fernandes | |
| 4,940,976 A | 7/1990 | Gastouniotis | |
| 4,996,624 A | 2/1991 | Schweitzer | |
| 5,008,651 A | 4/1991 | Schweitzer | |
| 5,038,246 A | 8/1991 | Durivage | |
| 5,070,301 A | 12/1991 | Schweitzer | |
| 5,089,928 A | 2/1992 | Durivage | |
| 5,136,457 A | 8/1992 | Durivage | |
| 5,136,458 A | 8/1992 | Durivage | |
| 5,140,257 A * | 8/1992 | Davis | 324/106 |
| 5,150,361 A | 9/1992 | Wieczorek | |
| 5,153,565 A | 10/1992 | Schweitzer | |
| 5,168,414 A | 12/1992 | Horstmann | |
| 5,196,682 A | 3/1993 | Englehardt | |
| 5,220,311 A | 6/1993 | Schweitzer | |
| 5,298,894 A | 3/1994 | Cerny | |
| 5,343,155 A * | 8/1994 | Kejariwal et al. | 324/522 |
| 5,420,502 A | 5/1995 | Schweitzer | |
| 5,438,329 A | 8/1995 | Gastouniotis | |
| 5,495,239 A | 2/1996 | Ouellette | |
| 5,519,527 A | 5/1996 | Panton | |
| 5,542,856 A | 8/1996 | Wood | |
| 5,550,476 A | 8/1996 | Lau | |
| 5,565,783 A | 10/1996 | Lau | |
| 5,648,726 A | 7/1997 | Le | |
| 5,656,931 A | 8/1997 | Lau et al. | |
| 5,659,300 A | 8/1997 | Dresselhuys | |
| 5,677,623 A | 10/1997 | Schweitzer | |
| 5,677,678 A | 10/1997 | Schweitzer | |
| 5,701,121 A | 12/1997 | Murdoch | |
| 5,793,214 A | 8/1998 | Wakamatsu | |
| 5,808,902 A * | 9/1998 | Levert et al. | 700/293 |
| 5,821,869 A | 10/1998 | Schweitzer | |
| 5,825,303 A | 10/1998 | Bloss | |
| 5,862,391 A | 1/1999 | Salas | |
| 5,877,703 A | 3/1999 | Bloss, Jr. et al. | |
| 5,889,399 A | 3/1999 | Schweitzer | |
| 5,892,430 A * | 4/1999 | Wiesman et al. | 340/538.16 |
| 5,990,674 A | 11/1999 | Schweitzer | |
| 6,002,260 A | 12/1999 | Lau | |
| 6,014,301 A | 1/2000 | Schweitzer | |
| 6,016,105 A | 1/2000 | Schweitzer | |
| 6,029,061 A | 2/2000 | Kohlschmidt | |
| 6,072,405 A | 6/2000 | Sears | |
| 6,078,785 A | 6/2000 | Bush | |
| 6,133,723 A | 10/2000 | Feight | |
| 6,133,724 A | 10/2000 | Schweitzer | |
| 6,177,883 B1 | 1/2001 | Jennetti | |
| 6,188,216 B1 | 2/2001 | Fromer | |
| 6,239,722 B1 | 5/2001 | Colton | |
| 6,326,905 B1 | 12/2001 | Walters | |
| 6,349,248 B1 | 2/2002 | Dean | |
| 6,366,217 B1 | 4/2002 | Cunningham | |
| 6,380,733 B1 | 4/2002 | Apel | |
| 6,414,605 B1 | 7/2002 | Walden | |
| 6,429,661 B1 | 8/2002 | Schweitzer | |
| 6,433,698 B1 | 8/2002 | Schweitzer | |
| 6,479,981 B2 | 11/2002 | Schweitzer | |
| 6,522,247 B2 * | 2/2003 | Maruyama et al. | 340/506 |
| 6,525,504 B1 | 2/2003 | Nygren | |
| 6,535,797 B1 * | 3/2003 | Bowles et al. | 700/286 |
| 6,573,707 B2 | 6/2003 | Kiriyama | |
| 6,577,608 B1 | 6/2003 | Moon | |
| 6,617,976 B2 | 9/2003 | Walden | |
| 6,662,124 B2 | 12/2003 | Salas | |
| 6,671,824 B1 | 12/2003 | Hyland | |
| 6,687,574 B2 * | 2/2004 | Pietrowicz et al. | 700/293 |
| 6,734,662 B1 | 5/2004 | Fenske | |
| 6,736,646 B2 | 5/2004 | Takahashi | |
| 6,751,562 B1 * | 6/2004 | Blackett et al. | 702/61 |
| 6,753,792 B2 | 6/2004 | Beckwith | |
| 6,759,933 B2 | 7/2004 | Fallak | |
| 6,792,337 B2 * | 9/2004 | Blackett et al. | 700/295 |
| 6,796,821 B2 | 9/2004 | Cairns | |
| 6,798,211 B1 * | 9/2004 | Rockwell et al. | 324/527 |
| 6,822,576 B1 | 11/2004 | Feight | |
| 6,828,906 B2 | 12/2004 | Malcolm | |
| 6,892,115 B2 * | 5/2005 | Berkcan et al. | 700/286 |
| 6,892,145 B2 * | 5/2005 | Topka et al. | 702/62 |
| 6,894,478 B1 | 5/2005 | Fenske | |
| 6,917,888 B2 * | 7/2005 | Logvinov et al. | 702/59 |
| 6,944,555 B2 | 9/2005 | Blackett | |
| 6,949,921 B1 | 9/2005 | Feight | |
| 6,963,197 B1 | 11/2005 | Feight | |
| 7,023,691 B1 | 4/2006 | Feight | |
| 7,053,601 B1 | 5/2006 | Fenske | |
| 7,106,048 B1 | 9/2006 | Feight | |
| 7,109,699 B1 * | 9/2006 | Bierer | 324/107 |
| 7,132,950 B2 * | 11/2006 | Stewart | 340/635 |
| 7,254,001 B2 | 8/2007 | Papallo | |
| 7,271,580 B1 | 9/2007 | Fenske | |
| 7,315,169 B1 | 1/2008 | Fenske | |
| 7,336,202 B2 * | 2/2008 | Kawai et al. | 340/870.17 |
| 7,382,272 B2 * | 6/2008 | Feight | 340/815.4 |
| 7,406,536 B2 * | 7/2008 | Efrati et al. | 709/238 |
| 7,430,932 B2 * | 10/2008 | Mekhanoshin et al. | 73/865.9 |
| 7,646,308 B2 * | 1/2010 | Paoletti et al. | 340/635 |
| 7,714,735 B2 * | 5/2010 | Rockwell | 340/635 |
| 7,725,295 B2 * | 5/2010 | Stoupis et al. | 702/185 |
| 8,018,337 B2 * | 9/2011 | Jones et al. | 340/539.14 |
| 8,059,006 B2 * | 11/2011 | Schweitzer et al. | 340/635 |
| 8,065,099 B2 * | 11/2011 | Gibala et al. | 702/62 |
| 8,067,946 B2 * | 11/2011 | Muench et al. | 324/543 |
| 2002/0089802 A1 | 7/2002 | Beckwith | |
| 2003/0020765 A1 | 1/2003 | Kussmaul | |
| 2003/0119568 A1 | 6/2003 | Menard | |
| 2003/0153368 A1 | 8/2003 | Bussan | |
| 2003/0174067 A1 | 9/2003 | Soliman | |
| 2003/0178290 A1 | 9/2003 | Schilling | |
| 2003/0179149 A1 | 9/2003 | Savage | |
| 2004/0005809 A1 | 1/2004 | Suzuki | |
| 2004/0032340 A1 | 2/2004 | Lingafeldt | |
| 2004/0036478 A1 | 2/2004 | Logvinov | |
| 2004/0067366 A1 | 4/2004 | Gorczyca | |
| 2004/0113810 A1 | 6/2004 | Mason | |
| 2004/0214616 A1 | 10/2004 | Malcolm | |
| 2004/0233159 A1 | 11/2004 | Badarneh | |
| 2005/0040809 A1 | 2/2005 | Uber | |
| 2005/0068193 A1 | 3/2005 | Osterloh | |
| 2005/0068194 A1 | 3/2005 | Schleich | |
| 2005/0079818 A1 | 4/2005 | Atwater | |
| 2005/0087599 A1 | 4/2005 | Ward | |
| 2005/0110656 A1 | 5/2005 | Patterson | |
| 2005/0132115 A1 | 6/2005 | Leach | |
| 2005/0151659 A1 | 7/2005 | Donovan | |

(56) References Cited

U.S. PATENT DOCUMENTS

| | | | |
|---|---|---|---|
| 2005/0163432 A1 | 7/2005 | Montena | |
| 2005/0205395 A1 | 9/2005 | Dietrich | |
| 2005/0215280 A1 | 9/2005 | Twitchell, Jr. | |
| 2006/0084419 A1 | 4/2006 | Rocamora | |
| 2008/0077336 A1 | 3/2008 | Fernandes | |
| 2009/0115426 A1* | 5/2009 | Muench et al. | 324/537 |
| 2009/0119068 A1* | 5/2009 | Banting | 702/188 |
| 2010/0013632 A1* | 1/2010 | Salewske et al. | 340/540 |

OTHER PUBLICATIONS

Cooper Industries, Ltd., GridAdvisor, OutageAdvisor Fault Detection and Location Solution, Sensus FlexNet Communications, Cooper Power Systems, 2008.

Cooper Industries, Ltd., GridAdvisor Exchange, Cooper Power Systems, 2008.

Cooper Industries, Ltd., GridAdvisor WebExchange, Cooper Power Systems, 2008.

Tollgrade Communications, Inc., LightHouse Continuous Grid Intelligence, Tollgrade Communications, Inc., 2008.

Wayne Honath, Sensors for Real-Time Distribution System Information: Key Elements of a 21st Century Grid, Tollgrade Communications, Inc., Jan. 2008.

S&C Electric Company, S&C IntelliRupter PulseCloser Specifications, Jul. 21, 2006.

Tollgrade Communications, Inc., Tollgrade Launches Distribution Grid Monitoring Product Line At Power Industry Event in Tampa Jan. 22-24, News Release, Tollgrade Communications, Inc., Jan. 15, 2008.

Atmel Corporation, Power Management Using the Embedded Stand-alone Wake-up Mode Protocol. Rev. 2, Aug. 2002.

Fisher Pierce Division of Pacific Scientific-Faulted Circuit Indicators—Technical Applications Data, Anh Le, Dave Donovan, Bill Doherty; 1995.

Fisher Pierce—Radio Faulted Circuit Indicator System—(1999)—Joslyn Hi-Voltage http://www.joslynhivoltage.com/PDFFiles/rfci.pdf.

S & C Electric Company—766-31 Specification Bulletin—(Dec. 18, 2006)—S & C IntelliRupter Pulse Closer Outdoor Distribution (15.5kV and 27 kV).

Patent Cooperation Treaty, PCT/US2009/051019, International Preliminary Report on Patentability and Written Opinion of the International Searching Authority, Jan. 18, 2011.

Patent Cooperation Treaty, PCT/US2009/051019, International Search Report, Sep. 15, 2009.

Radio Receivers Series 1560 Handheld or RTU/SCADA, Joclyn Hi Voltage http://www.joclynhivoltage.com/spec1560.htm, Jul. 21, 2008.

Bulgin 400 Series Buccaneer, www.bulgin.com.uk, Dec. 9, 2003.

\* cited by examiner

TRANSCEIVER INTERFACE FOR POWER SYSTEM MONITORING

TECHNICAL FIELD

This disclosure relates to communications from faulted circuit indicators. More particularly, this disclosure relates to filtering the communications from faulted circuit indicators and sending only selected communications to a central monitoring system.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

I. Overview

Processes and distributed systems are often monitored, automated, controlled or protected by a central monitoring system. Some examples of central monitoring systems include supervisory control and data acquisition (SCADA) systems, outage management systems, automatic meter reading (AMR) systems, advanced metering infrastructure (AMI) systems, other communications systems, and the like. One such process or distributed system that is typically monitored and controlled by a monitoring system is electric power transmission and distribution. The monitoring system may be configured to receive data, events, and actions taken on the power system from various devices on the electric power transmission and distribution system. Accordingly, the supervisory control operations made at the monitoring system level are only as appropriate as the data received from the power system devices is timely and accurate. Thus, monitoring systems require that the data received from the various power system devices be timely and accurate.

As mentioned above, electric power protection, automation, control, and monitoring may involve the use of various devices intended to gather and/or process power system information from the electrical power system equipment. Faulted circuit indicators (FCIs) are one type of such device, and may be used to indicate the presence of a fault and/or other events on a conductor. Various types and functions of FCIs are described in U.S. Pat. Nos. 3,676,740, 3,906,477, 4,063,171, 4,234,847, 4,375,617, 4,438,403, 4,456,873, 4,458,198, 4,495,489, 4,974,329, 5,677,678, 5,990,674, 6,014,301, 6,016,105, 6,133,723, 6,133,724, 6,429,661, 6,433,698, 6,479,981, 6,734,662, 6,822,576, 6,894,478, 6,949,921, 6,963,197, 7,023,691, 7,053,601, 7,106,048, 7,271,580, and 7,315,169, each of which is herein incorporated by reference in its entirety.

FCIs often include means of detecting and processing various power system conditions. Among those are the current, voltage, and temperature. Temperature is typically measured using a diode that is part of a processor on the FCI. With these measured conditions, the FCI can perform various calculations to determine whether an event has occurred on the power system such as a permanent fault, a temporary fault, an overcurrent condition, an undervoltage condition, a high temperature condition, an inrush condition, a backfeed condition, direction of current flow, loss of potential, a switching transient, a system overload, an exceeded load profile, and the like.

FCIs may further include a means of communication to a monitoring system such as via radio frequency, fiber optics, copper wire, and the like. Typically, FCIs with the ability to communicate to the monitoring system are configured to communicate every event and/or at predetermined time intervals. This results in communication of vast amounts of data back to the monitoring system, leading to an overload of information for the system.

Further, though FCIs have been used for many years to assist electric utility personnel to locate faulted sections of power line more efficiently, FCIs may tend to false trip and/or false reset. These false tripping and false resetting events provide misleading information to linemen and reduce the perceived reliability of FCIs. Most of the sources of undesirable operation can be attributed to misapplication or human error. However, because most FCI events are a result of a detection of a peak current and FCIs have no inherent means of discriminating fault current from other overcurrent event, they may misoperate by indicating a fault when the line is not faulted. Further, FCIs typically have no inherent means of discriminating between load current and backfeed current, leading to similar misoperations. Consequently, due to the various possible misoperations, utility personnel may loose trust in the devices. Further, because misoperations may lead to communications of events back to the monitoring system (in schemes where the FCIs are capable of communicating events back to the monitoring system), misinformation concerning those events may cause improper reaction. Because of the many communications due to misoperations, the monitoring system may become overwhelmed with data provided by the FCIs.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described will be illustrated as software modules or components. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a machine-readable medium having stored thereon instructions that may be used to program a computer (or other electronic device) to perform processes described herein. The machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

II. Transceiver Interface Filtering Scheme

Figure 1:
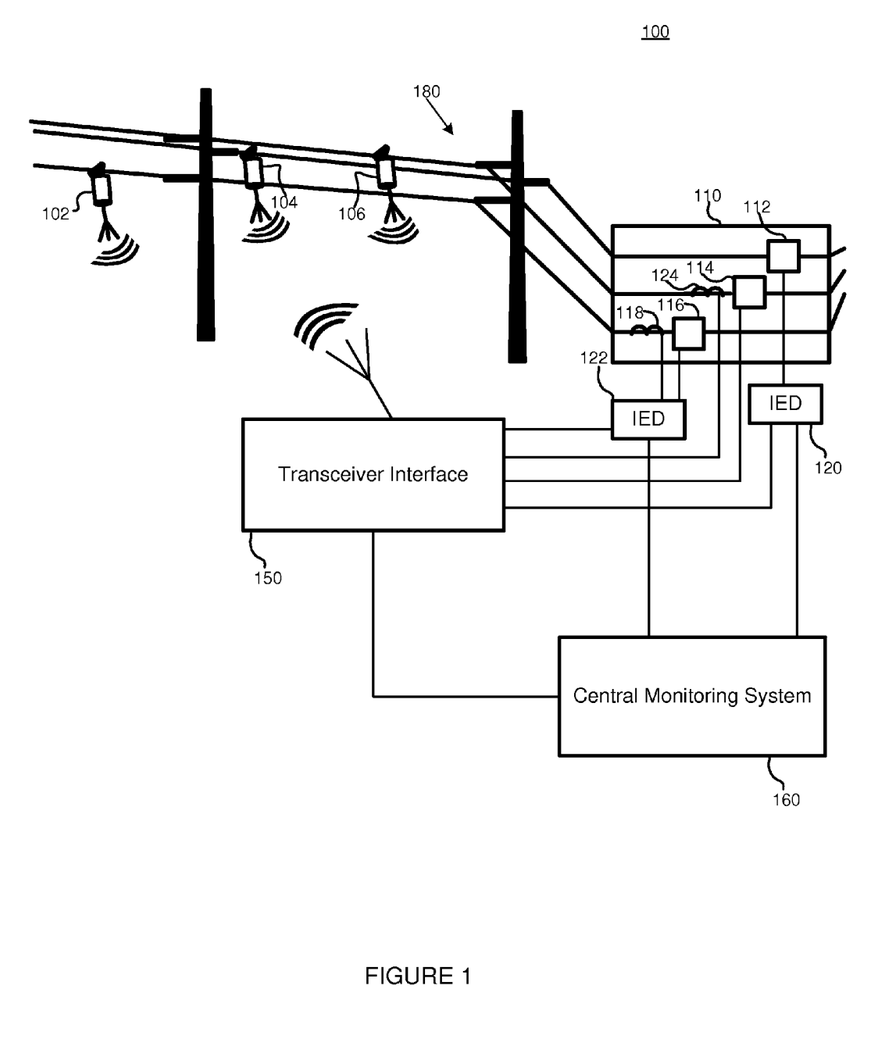
FIG. 1 is a block diagram illustrating a system for filtering data from faulted circuit indicators.

FIG. 1 is a block diagram illustrating a system 100 for communicating information from a faulted circuit indicator to a monitoring system. As can be seen, FIG. 1 illustrates a typical three-phase electric power distribution system 180, and a substation 110 that includes interrupting devices 112, 114, and 116 for each of the three phases. The interrupting devices may be any device configured to interrupt electric current on the system such as, for example, circuit breakers, reclosers, switches, fuses, and the like.

The interrupting devices and/or the phases may further be monitored, protected, controlled, and/or automated by various intelligent electronic devices (IEDs). IEDs are typically computer-based relays such as those sold by Schweitzer Engineering Laboratories, Inc. of Pullman Wash. Further, the IEDs may consist of remote terminal units (RTUs) configured to monitor the power system and communicate power system information back to a central computer, monitoring system, or the like. IEDs 122, 120 may further be configured to communicate power system information including, but not limited to, currents, voltages, resistances, reactances, distance to fault, phasors, synchrophasors, impedances, contact outputs, statuses (such as a circuit breaker status, for example), and the like.

As can be seen, FCIs 102, 104, and 106 are installed on the overhead conductors of the electric power distribution system 180. Each of the three FCIs 102, 104, and 106 are of the type that includes a means for radio communication and an antenna. The FCIs 102, 104, 106 may be configured to broadcast a status message upon detection of an event and/or following the passage of a predetermined amount of time (scheduled reporting).

As can be seen, the FCIs 102, 104, and 106 are configured to broadcast the status messages and the Transceiver interface (TI) 150 is configured to receive the status messages. TI 150 includes a means for receiving radio frequency messages such as an antenna and a transceiver. TI 150 may further be configured to receive power system information either directly from the power system or from IEDs connected to the power system. FIG. 1 illustrates one example where IED 122 receives power system information from sensor (in this example a current transformer) 118 and interrupting device status from interrupting device 116. IED 122 can then communicate power system information to the TI 150. Further, illustrated is IED 120, which receives interrupting device status from interrupting device 112, and may be configured to communicate this interrupting device status to TI 150. Further still, illustrated is a communications link between TI 150 and interrupting device 114 allowing TI 150 to gather interrupting device status information from interrupting device 114. Likewise, illustrated is sensor (in this example a current transformer) 124 in communication with TI 150 such that TI 150 may gather power system information therefrom.

It is contemplated that any such scheme for communicating power system information from the power system to TI may be used. As many interrupting devices and conductors are monitored by IEDs, it may be easiest for utilities to simply configure those IEDs to send power system information to the TI 150. Even so, it is contemplated that TI may employ known techniques for acquiring power system information directly from power system equipment and sensors as IEDs typically do.

Further illustrated is that IEDs 120 and 122 have a communications link to the monitoring system 160. Thus, the monitoring system is capable of receiving data directly from the IEDs. Though IEDs provide a great deal of information to the monitoring system 160, fault location on a distribution system is difficult to derive solely from such information. For example, though an IED may be capable of detecting a fault and calculating a distance to the fault, the distribution system may have several branches, resulting in several possible locations of a fault. Further, because there are typically several pieces of distribution equipment such as transformers, capacitor banks, voltage regulators, and the like on the distribution system, distance calculations may be flawed. Accordingly, power system information from FCIs installed on conductors throughout the electric power system may be of much value to the monitoring system 160 to better determine location of a fault.

According to the present disclosure, therefore, the monitoring system is also capable of receiving power system information from TI 150. TI 150 is configured, as described in more detail herein, to receive radio frequency communications from the FCIs 102, 104, and 106, and compare it against other power system information either received from the IEDs 120, and 122 or from the power system itself before communicating the power system information gathered from the FCIs 102, 103, and 106 to the monitoring system 160. The result is that the monitoring system 160 receives power system information from FCIs that has been verified with power system information from other sources, thus decreasing the degree to which power system information from the FCIs communicated to the monitoring system includes misinformation due to misoperation by the FCIs. A further result is a decrease in the overall communication of power system information from FCIs to the monitoring system. That is, the present disclosure describes a system of only transmitting filtered or validated data to the monitoring system instead of a system where all status messages from all FCIs are communicated to the monitoring system.

The monitoring system of the present disclosure may be any system configured to receive information from the IEDs, FCIs, and/or TIs. The monitoring system may be a stand-alone monitoring system, or part of a larger monitoring scheme. For example, the monitoring system may be or may be part of a larger outage management system configured to monitor and/or locate faults or outages on an electric power system. The monitoring system may include an existing communications infrastructure. The monitoring system may be a SCADA system or pass data along to a SCADA system. The monitoring system may be or pass data along to an AMR or AMI system. Other monitoring systems are also within the scope of this disclosure.

a. Faulted Circuit Indicator with RF Communications

As described in FIG. 1, the FCIs of the present disclosure are capable of communicating power system information to the TI. It is contemplated that any means of such communication is within the scope of this disclosure. Such means may include, for example, radio frequency, fiber optic, copper wire, and the like. Several examples are described herein where the communication from the FCI to the TI is over radio frequency, though other means of communication are contemplated.

Figure 2:
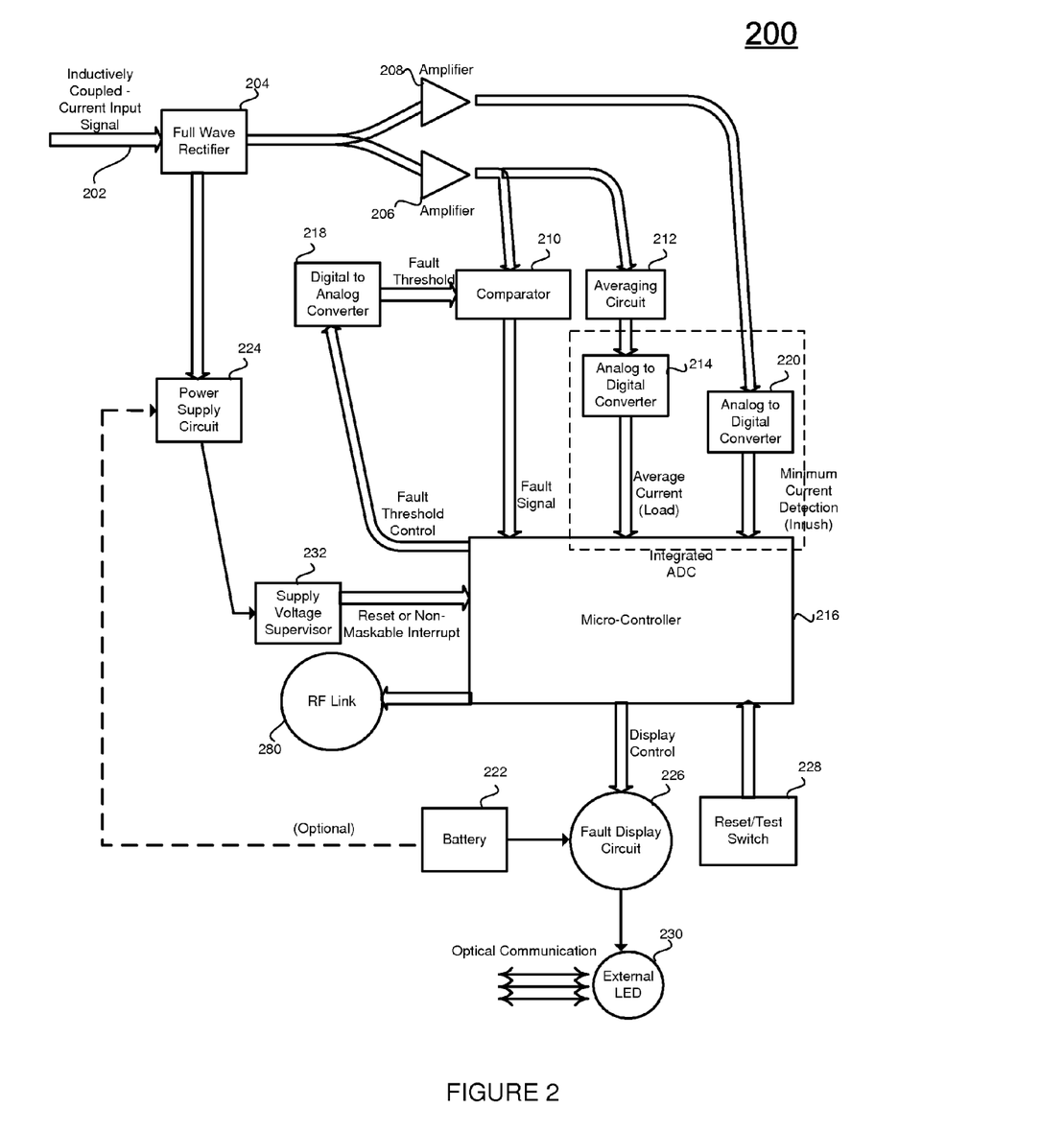
FIG. 2 is a block diagram of a faulted circuit indicator.

FIG. 2 is a block diagram illustrating the electronic circuitry, generally designated 200, of a faulted circuit indicator that may be used with the present disclosure. A current acquisition circuit (not shown), which may include a current transformer, senses current in a monitored conductor including any fault currents. The acquired/monitored current 202 passes through a full wave rectifier 204, and into a pair of amplifiers 206 and 208. The output of amplifier 206 is routed to comparator 210, which generates a fault signal in the manner described below. The output of amplifier 206 is also routed through an averaging circuit 212, and then into an analog to digital converter (ADC) 214 which may be an inherent accessory of processor 216. Alternatively, averaging circuit 212 may not be present, and processor 216 will determine the instantaneous and average current using algorithms well known in the art. Based on the measured average current, processor 216 will program a digital to analog converter (DAC) 218 to generate an input signal to comparator 210.

The output from amplifier 206 is tied to the positive input terminal of comparator 210. The negative input terminal of comparator 210 is sourced by DAC 218, which is programmed by processor 216. In this way, processor 216 can control the threshold level of comparator 210. Adjusting the threshold of comparator 210 directly controls the fault current threshold (i.e.; the level of current in the monitored conductor that is considered a fault) and provides the means for auto-ranging.

The output of amplifier 208 is shown being passed through a second ADC 220. Note that a single ADC and a multi-position analog switch could be used as well. Processor 216 uses the input from this second ADC 220 to monitor the peak current detected by the current acquisition circuit approximately once every half-cycle period. If the monitored peak current is not sufficiently large, processor 216 will record the time. If the monitored peak current is of sufficiently small magnitude for a predetermined time period the processor 216 will place the fault indicator into system detect state, which is the method in which inrush lockout is accomplished. System detect state is discussed later in the application. The particular magnitude below which the current must fall before system detect state is triggered is determined by the value of the monitored average current. Additionally, the fault threshold that is determined from the monitored average current is saved in the processor non-volatile memory such that the re-energization level will be configured in the event that the processor loses power during an outage.

FIG. 2 also shows an optional battery 222, which can provide backup power to power supply circuit 224, processor 216, display control 226, RF link 280, or some subset thereof. Power supply circuit 224, which consists of one or more DC regulators and required support circuitry, provides regulated power to all circuits in the fault indicator. It receives unregulated power from either external battery 222 or full wave rectifier 204. Supply voltage supervisor 232 monitors the power quality of power supplied by power supply circuit 224 and forces processor 216 into reset if the quality of the supplied power is inadequate. In addition, FIG. 2 shows display controller 226, which is controlled by processor 216. The actual display could be, for example, LEDs or a mechanical rotor display. FIG. 2 also shows reset/test switch 228. Reset/test switch 228 allows maintenance personnel to manually reset the fault indicator and clear any faults, or, if no faults have been noted, to test the operation of the fault indicator and ensure that it can properly display the occurrence of any faults.

FIG. 2 also shows external LED 230 coupled to and controlled by processor 216. External LED 230 is a means to optically communicate with a remote computer or other device monitoring the battery level of the fault indicator. Such communications could take place over fiber-optic lines. In response to various circuit conditions, processor 216 activates display control 226 to indicate that a permanent or temporary fault has occurred. In addition, the fault indicator can optionally provide a monitoring system output signal (not shown), which would also be controlled by processor 216. If the fault indicator is of the targeted type processor 216 can set the target to the fault indicating condition, or it can reset the target to the normal condition after a timed reset interval. Processor 216 may optionally display information on a seven-segment display, such as the amount of elapsed time since a fault occurred. Processor 216 may also be optionally provided with a radio frequency (RF) link to communicate with the monitoring system via, for example, a transceiver interface.

In addition to the above, the FCI may be configured to detect other power system events using the available information and algorithms in the microprocessor. For example, the microprocessor may be programmed to detect for loss of voltage, compare a load against a load profile, count the number of events by event type (permanent faults, temporary faults, and the like), record the amount of time between events, record the amount of time between an event and sending a message, record the amount of time between detecting an event and being interrogated, and the like.

As for the exceeded load profile, the FCI may include a load profile defining acceptable load conditions over time and be configured to indicate that an event has occurred if the load exceeds the load profile. For example, the load profile may indicate acceptable conditions unless the total time in an overcurrent condition is over 10 hours. Thus, once the FCI detects that the total time spent in an overcurrent condition is greater than 10 hours, it indicates an event. Another possible load profile may be that an overcurrent condition must persist for a predetermined amount of time. As long as the overcurrent condition does not exceed the predetermined amount of time, no event is issued for that profile. If, however, an overcurrent condition exists for the predetermined amount of time, the FCI does issue an event for that load profile.

As described above, the FCI may be configured to only communicate to the TI under certain circumstances. For example the FCI may be configured to initiate a message to TI after the passage of a predetermined amount of time (scheduled reporting). In such a configuration, the FCI would also include a clock module configured to track the passage of time. The FCI may include a predetermined message configuration and simply populate the message with data and transmit the populated message upon a lapse of the predetermined amount of time or on a report schedule. For example, the FCI may be configured to populate and transmit a report every eight hours. The predetermined message configuration may include areas for populating the detected current, detected voltage, whether a permanent fault is detected, whether a temporary fault has been detected, detected temperature, the fault detection level, whether an inrush condition was detected, the number of previous faults detected, an expected remaining lifetime, identification information, and the like.

The FCI may be configured to send a message to TI upon receiving an interrogation from TI. In such a configuration, the FCI would be capable of receiving an instruction from TI to configure and send a status message containing either a preconfigured set of data, or a set of data required by TI. The existing RF link may be used to receive the message from TI, communicate it to the micro-controller 216, and communicate the resulting message from the micro-controller 216 to TI. The micro-controller 216 may be configured to populate data in a pre-configured message. For example, the pre-configured message may be the status message that the FCI transmits upon the passage of time or the occurrence of an event. As above, the pre-configured message may include data such as the detected current, detected voltage, whether a permanent fault is detected, whether a temporary fault has been detected, ambient temperature, the fault detection level, whether an inrush condition was detected, the number of previous faults detected, an expected remaining lifetime, identification information, and the like.

Further, the TI may interrogate for specific power system information, in which case the micro-controller 216 would populate a message with only the information required by the TI, and cause the message to be transmitted to the TI. In this configuration, the message may be preconfigured, and the FCI would only populate the fields corresponding with the information required by TI. Further, the message may be preconfigured with certain data that is required to be in each message such as FCI identification information. The message may be configured based on what was requested by the TI. After the message is populated, the FCI would cause the message to be communicated to TI using, for example, the RF link 280 used to receive the interrogation from the TI.

In an embodiment, the FCI may configure and transmit a status message upon the occurrence of an event. The event may be any event condition detectable by the FCI. For example, the event may be any of: detection of a permanent fault, detection of a temporary fault, detection of load current above a certain threshold and/or for a predetermined amount of time, an overcurrent condition, an undervoltage condition, a loss-of-voltage condition, a high-temperature alarm, a change in fault detection levels, lapse of a predetermined amount of time, expected FCI lifetime falling below a predetermined threshold, an exceeded load profile, and the like.

If an event is detected by the FCI, the micro-controller 216 is configured to either create or populate a status message and cause the RF link 280 to transmit the message to the TI. In the embodiment where the message configuration is predetermined, the microcontroller populates the fields of the message with the required information. In the configuration where the message configuration is not predetermined, the FCI may form a message with the event type, and may include FCI identification information as well. The FCI causes the message to be transmitted once the message is formed.

The FCI may further be configured to transmit a status message to TI upon occurrence of any of the message triggers described above.

The FCI may include a clock or other timing device and start a timer when an event is detected. The microcontroller may stop the timer upon receiving an interrogation and include the lapsed time in the status message.

In one embodiment, the FCI may be configured to transmit a status message only after a predetermined amount of time after the detection of an event if the FCI has not yet been interrogated by the TI. In this embodiment, the FCI would initiate a timer upon occurrence of an event (if the event is a fault and no current is flowing through the conductor, the battery may be necessary to run the timer). If the FCI were not interrogated by the TI for a status message before the timer runs out, then the FCI would initiate a status message to the TI. In one embodiment, once the FCI has been interrogated, it cancels the timer, and does not send a status message solely based on the lapse of the timer.

In one embodiment, the FCI is configured such that it does not send a status message to the TI unless it is interrogated thereby. This saves battery life of the FCI in that status messages are not sent unless they are needed by the TI.

In one embodiment, the TI may be capable of signaling the FCIs not to send a status report. Upon receipt of such a message, FCIs would not send a status message until the next time that the FCI is configured to send a status report (upon further interrogation, event occurrence, passage of time, or the like).

One field of information in the status message that the FCI may send to the TI that may help with fault location is FCI identification information. This identification information may include, for example, an FCI serial number, GPS coordinates of the FCI, or other FCI identification information. Another possible identification information may be a pole number of a power pole near where the FCI is installed. Several electric power utilities maintain maps of power distribution systems using power pole numbers. In this case, the pole number may give the best information as to the location of the FCI that detected the event. This identification information may be stored either in the micro-controller 216 or within a memory storage (not separately pictured). The FCI identification information may be preprogrammed into the FCI by the manufacturer (e.g. a serial number programmed into the FCI by the manufacturer) or writeable to the FCI by either the manufacturer or the end user. The RF link, or optical communication via the external LED 230 may be used to program the FCI identification information into the FCI.

One helpful type of FCI identification information that may be programmed into the FCI is GPS coordinates of the installed FCI. In this embodiment, when the FCI is installed, the GPS coordinates of the FCI may be calculated (using a GPS device), and programmed into the FCI using, for example, the RF link or the optical communication via the External LED 230.

Alternatively, the GPS coordinates may be calculated when the FCI is installed and associated with other FCI identification information in a database. For example, when the FCI is installed, the GPS coordinates may be calculated and recorded along with the installed FCI serial number. Thus, using the FCI serial number, the exact location of the FCI may be determined using the GPS coordinates and the database correlating the two types of information.

FCI location information may be useable by the SCADA scheme and/or the TI to determine the location of the FCI and for correlating status messages from the FCI with other power system information. The location of the FCI is helpful in determining the location of an event on the electric power system. For example, where two FCIs are adjacent on the same conductor, and one reports a fault and the other does not, then the fault is likely somewhere on the conductor between those two FCIs.

b. Transceiver Interface

Figure 3:
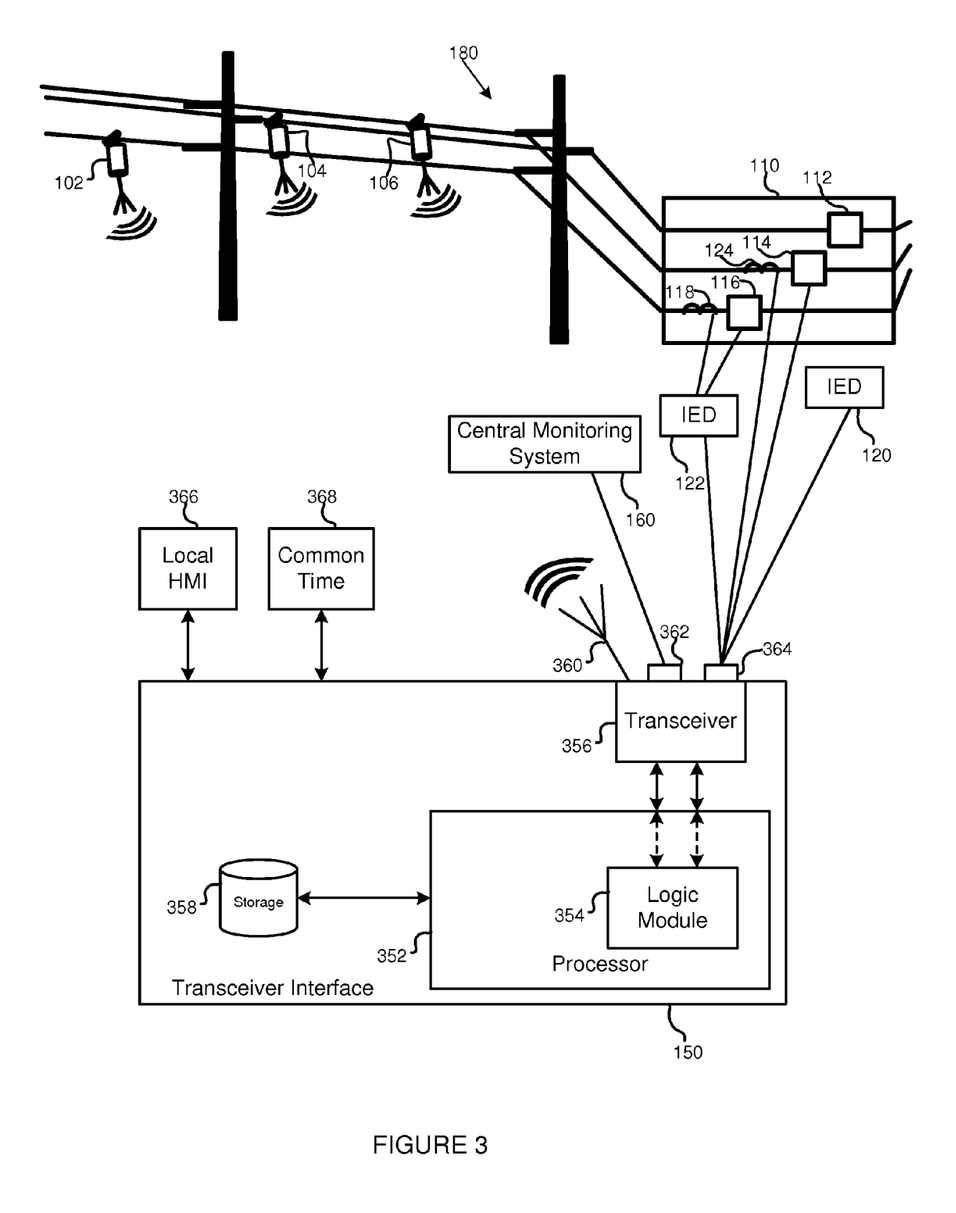
FIG. 3 is a block diagram of a transceiver interface.

Turning now to FIG. 3, a block diagram of the Transceiver interface (TI) 150 is illustrated in more detail. As is described above, the TI 150 is capable of receiving communications from FCIs, the power system (and/or IEDs connected to the power system), and transmitting information to the monitoring system. It is contemplated that the TI 150 may be a stand-alone device, or that it may be part of another intelligent device for automation, control, monitoring, or protection of the electric power system. For example, the TI may function on an IED capable of receiving power system data from FCIs and from the power system (or another IED, as needed). The TI may function as a unit within a monitoring system (such as SCADA), receiving IED and FCI communications, and filtering such as described herein before passing on the FCI information to the monitoring system.

Illustrated in FIG. 3 is a TI 150 receiving communications from the FCIs 102, 104, and 106, IEDs 120 and 122, and from the electric power system, specifically from interrupting device 114 and sensor (in this example, a current transformer) 124. The TI includes a transceiver module 356 for receiving and transmitting messages. The transceiver module 356 is in communication with various communications ports 362, and 364. The communications ports may be any known in the art such as, for example, fiber-optic, radio frequency, copper wire (9-pin, serial, RJ-45, USB, and the like), and so forth. There may be a plurality of communications ports, even one for each connected device.

TI 150 further includes a communications port 362 for communication with the monitoring system 160 for transmitting data to the monitoring system 160 and if needed for receiving data from the monitoring system 160. For example, when the TI is within an IED, it may receive commands from the monitoring system to open a line such as by opening the interrupting device 114.

TI also includes a RF communications port 360. The RF communications port 360 may be connected directly to the TI 150, or may be simply in communication with the TI 150. For example, the RF communications port 360 may be a cable leading to an RF antenna. Further, the RF communications port 360 may include an intermediate device such as a modem or external radio. One such intermediate device may be the SEL-3021-1 or SEL-3021-2 serial encrypting transceiver (available from Schweitzer Engineering Laboratories, Inc.) used to encrypt and/or decrypt data communicated with the FCIs. If the SEL 3021-1 or SEL 3021-2 is used, a separate RF transceiver is needed to transmit the communications over RF.

Another such intermediate device may be the SEL 3022 Wireless Encrypting Transceiver (available from Schweitzer Engineering Laboratories, Inc.) used to encrypt and/or decrypt data communicated with the FCIs and for wireless communication of such data.

The RF communications port 360 is configured to receive RF communications from the FCIs 102, 104, and 106 and communicate such to the transceiver module 356. In an embodiment, the RF communications port 360 is also configured to transmit communication from the TI 150 to the FCIs 102, 104, and 106 such as interrogation of the FCIs.

The TI further includes a processor 352 (which may be a device such as an application specific integrated circuit (ASIC), field programmable gate array (FPGA), microprocessor, or the like) in communication with the transceiver. The processor 352 includes a logic module 354 operating thereon. The logic module 354 is configured to receive power system information from various sources and verify such information through comparison. In an embodiment, the logic module 354 is configured to receive and parse status messages from FCIs 102, 104, and 106, and power system information from other sources (such as the power system itself or IEDs connected thereto, as described herein) and compare the power system information from status messages from the FCIs 102, 104, and 106 against the power system information from other sources. If the power system information from other sources agrees with the power system information from the FCIs, then the logic module 354 is further configured to have the power system information from the FCIs formatted into a format expected by the monitoring system 160 and transmitted to the monitoring system 160 using the transceiver module 356 and the communications port 362.

For example, if FCI 102 determines that there is a fault on the monitored conductor, it may be configured to send a status message containing such information and identification information to the TI via the RF communications port 360. The status message is then communicated to the logic module. Similarly, IED 122 is monitoring the same phase as FCI 102, and may be configured to constantly send status messages to TI 150 via the communications port 364. The logic module 354 is configured, in this example, to parse the message from FCI 102 to determine the identification information (including the monitored phase), and that the FCI 102 has determined that there is a fault on that phase. The logic module 354 is further configured to parse the status message from IED 122 to determine whether IED 122 has also detected a fault on the monitored phase. If the status message from the IED 122 also indicates the presence of a fault on the phase monitored by FCI 102, then the logic module is configured to have the processor transmit the status message from the FCI to the monitoring system 160.

As mentioned above, the monitoring system 160 may expect the message to be communicated according to a particular protocol (e.g. DNP, MODBUS, IEC-61850, and the like). The processor may be configured to format the status message according to the expected protocol before sending the status message to the monitoring system 160 via the transceiver module 356 and the communications port 362.

The logic module 354 is further configured to interrogate the IEDs 120 and 122 for status information in an effort to verify a status message received from an FCI 102, 104, and 106.

The transceiver module 356 may be in communication with the power system via a communications port 364. In this embodiment, the TI 150 may be capable of making calculations on the received power system data as an IED would do to derive power system information that may be used to verify status messages from FCIs. For example, if the received information is a current and breaker status (from interrupting device 114 and current transformer 124), the processor 352 may be configured to filter and process the current information as is known in the art to determine whether there is a fault on the conductor.

The logic module 354 may be configured to have an FCI interrogated so that the FCI sends, and the TI receives a status message from the FCI in an effort to verify power system information received from either the power system or an IED. The logic module 354 may be configured to have an FCI interrogated to receive a status message so that a location of an event may be determined when an event is either derived from the received power system information or received from an IED. The logic module 354 may trigger the processor 352 to configure and send an interrogation message to the FCIs requesting a status message from each FCI.

The logic module 354 may be configured to trigger the processor 352 to configure and send an interrogation message to a particular one of the FCIs requesting a status message from that particular FCI. In this case, the interrogation message may include the FCI identification information, and each FCI receiving the interrogation message would be configured to compare the received FCI identification information against its own FCI identification information and respond to the request only if the two match.

The processor 352 may be configured to request specific information in the interrogation message. Alternatively, the processor 352 may be configured to simply request a status message. In either case, the FCIs may be configured to respond to the particular request presented in the interrogation message as described above.

The logic module 354 may further be configured to use the received response to the interrogation message as is described above to either verify the power system information received from the power system and/or IEDs, and have the status message from the FCI communicated to the monitoring system 160.

As described above, the FCIs may be configured to record a time between detecting an event and receiving an interrogation from the TI. The time elapsed is written into the status message and sent to the TI. The TI may then use the elapsed time with the event detected to time align this event with events detected by other FCIs and reported to the TI. In an alternative embodiment, each FCI may include a clock and include the time of the event in the status message. However, as the time kept by the individual clocks may drift, these time stamps may not be as accurate. In one embodiment, each FCI also includes a clock with access to a common time source such as described below. Such FCIs could include a time stamp from the common time source for proper time alignment of status messages and/or events by the TI and or the monitoring system.

As is illustrated, the TI 150 may further be in communication with a local human-machine interface (HMI) 366. The local HMI 366 may be useful in operating the TI 150. The local HMI 366 may be in communication with the TI 150 to change and/or apply settings, set message configurations, set the monitoring system communications protocols, upload a database of FCI identification and location information, and the like.

TI 150 further includes a data storage module 358 that may be any medium capable of data storage known in the art. The processor 352 may be configured such that certain information may be written to and/or received from the data storage module 358. For example, a database of FCI identification and location information may be written to the data storage module 358. Further, certain events reports, FCI status messages, power system information, and the like may be written to the data storage module 358.

TI 150 may further be in communication with a common time source 368. The common time source 368 may be provided by various time sources including, but not limited to: a Global Positioning System (GPS); a radio time source, such as the short-wave WWV transmitter operated by the National Institute of Standards and Technology (NIST) at 2.5 MHz, 5 MHz, 10 MHz, 15 MHz, and 20 MHz, or a low frequency transmitter, such as WWVB operated by NIST at 60 Hz; a cesium clock; an atomic clock; and the like. TI 150 may use time information from the common time source 368 to apply time stamps to certain data, and/or for comparing data from FCI status messages with other power system data. IEDs also often receive common time information, and are often capable of applying time stamps to the data.

III. Examples

FIGS. 4-7 illustrate specific examples of the use of the present disclosure on an electric power system. Each figure includes various monitored conductors, interrupting devices, FCIs, TIs, and the like. Each figure also includes a substation with an associated IED receiving radio communication from the TIs. It is contemplated that the substation IED may be an intelligent electronic device that is part of the monitoring system or communicates information to the monitoring system. Further, though several TIs are illustrated in each figure, it is contemplated that each TI may be combined into one TI and/or modules operating on a single device. Further, though RF communications are shown between the TIs and the substation IED, it is contemplated that such communication could be by other methods.

Figure 4:
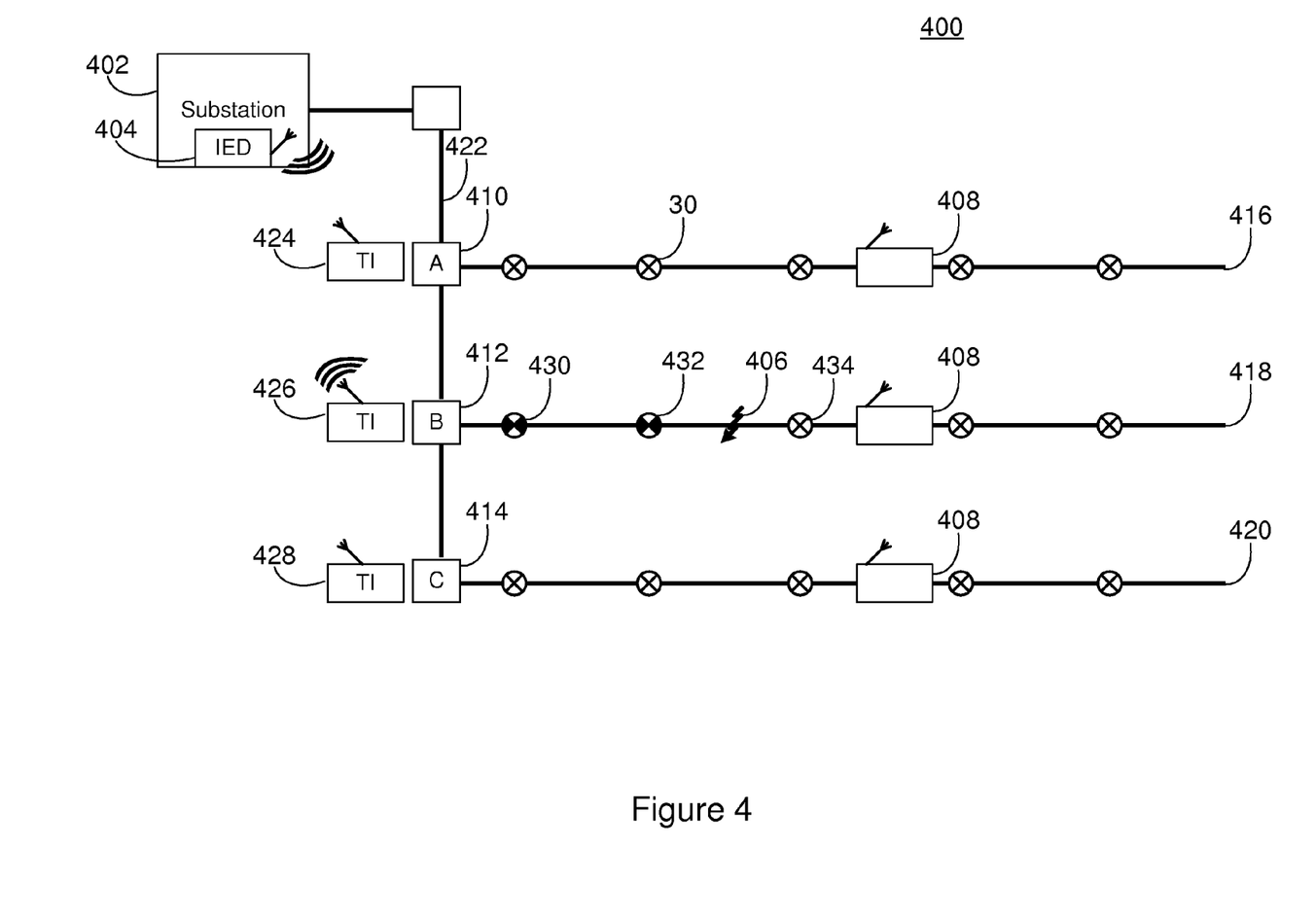
FIG. 4 illustrates a line diagram of a power system using the present disclosure.

Turning now to FIG. 4, a line diagram of an electric power system 400 with associated FCIs 30, interrupting devices 410, 412, and 414, TIs 424, 426, and 428, conductors 416, 418, and 420 are shown along with its associated substation 402 and substation IED 404. FCIs 30 with communications capabilities are used in conjunction with IEDs for protection, automation, and control of an electric power system. As shown in FIG. 4, the portion of an electric power system 400 includes a substation 402 with a substation IED 404. The substation 402 includes a bus 422 with three phases of power lines 416, 418, and 420. Each phase includes a TI 424, 426, and 428 (either separate units or a single unit) capable of communication with the substation IED 404. Though RF communication is illustrated, the communication between the phase TIs 424, 426, and 428 and the substation IED 404 may be by any means such as, for example, RF, electrical contacts such as over wire cables, infrared, over fiber optics, and the like. Each line 416, 418, and 420 has various FCIs 30 associated therewith for indicating the presence of a fault on the line. The FCIs 30 are also capable of communication with the TI that is on the same line as the FCI. For example, the FCIs on the A phase line 416 are capable of communication with the TI 424 for the A phase line 416. Each line 416, 418, and 420 may also include another IED 408 on the line such as a recloser control. As in FIG. 1, though not illustrated, each line may also include one or more branches, reclosers, interrupting devices, and the like.

FIG. 4 also indicates the presence of a fault 406 on the B-phase line 418 after the first two FCIs 430 and 432 on the line. The first two FCIs 430 and 432 would experience an overcurrent situation, determine that a fault has occurred, and indicate that a fault has occurred on the line. The TI 426 associated with the B-phase line 418 would also detect the overcurrent situation using the other collected data (as discussed above). If TI 426 is also a protective device, it may trip an interrupting device and/or send a message that there has been a fault on the line.

The TI 426 (acting as a protective relay) may also attempt to calculate the distance to the fault 406 using conventional fault distance algorithms. However, because the line 416 may include branches, capacitor banks, voltage regulators, transformers or other equipment, the location of the fault may not be known or calculable by a distance-to-fault calculation. Further, certain conditions of the fault and the line make the calculation of the distance to the fault less accurate. For example, the duration of the fault affects the accuracy of the fault distance calculation.

The TI 426 could also use its communication capabilities with the FCIs on the line to narrow down the location of the fault occurred on the line. In one scenario, the FCIs would be programmed such that they would indicate a fault, but would not communicate to an TI that they sensed a fault until either a predetermined amount of time had passed or the TI interrogated the FCI about whether it detected a fault. For example, TI 426 in detected the fault 406. In order to determine where the fault 406 is (or verify the location of the fault with its calculation of the distance to the fault), the TI 426 would interrogate one of the FCIs to determine if the FCI also indicated the presence of the fault. The TI could interrogate the FCIs one at a time so that not all FCIs are interrogated, and not all FCIs would use up battery life on communication with the TI, thus saving battery life of the FCIs.

The TI 426 may start with interrogating the first FCI 430. When the first FCI 430 reports the fault, then the TI 426 will interrogate the next FCI 432, and so forth, until it gets to the first FCI that does not report the fault 434. The TI would then conclude that the fault is between the last FCI that reported a fault 432 and the first FCI that did not report the fault 434. If the FCIs are programmed to report a fault after a predetermined amount of time, then interrogation by the TI may set the FCIs to not report the presence of that fault.

The TI 426 may use its calculated distance to the fault 406 to intelligently interrogate the FCIs. Here, it may be helpful for the TI to have knowledge of the "line distance" (distance on the power line instead of a straight-line or "as the crow flies" distance) to each of the FCIs, and coordinate this information with the particular identification information of each FCI. This information can be calculated and stored in, for example, a lookup table within the TI 426. Other methods for calculating and/or coordinating FCI location with its line-distance from the TI 426 may be used. If the TI 426 calculates that the fault 30 is a certain distance down a particular line, and looks up the adjacent FCIs using the lookup table. Thus, the TI 426 may calculate that the fault would lie between FCIs 432 and 434, then the TI 426 may begin its interrogation with the FCI 432 it calculates as adjacent and previous to the fault 406. When that FCI 432 reports the fault, the TI 426 could then interrogate the FCI 434 that it calculates as immediately after the fault 406. When the FCI 432 immediately before the fault reports the presence of the fault, and the FCI 434 immediately after the fault reports no fault, then the TI 426 can confirm that the fault is on a portion of the line between the FCIs 432 and 434. The TI 426 may then signal the remaining FCIs on the line 418 to not report the presence or absence of a fault or loss of potential. The TI 426 may further communicate to the substation IED 404 that the fault 406 is on the feeder 418 associated with that TI 426, and may also communicate the location of and/or distance to the fault 406. The TI 426 may also communicate to the substation IED 404 that the location of and/or distance to the fault 406 have been checked by interrogating the FCIs. The substation TI 426 can use this information to communicate to a technician the presence of, distance to, and/or location of the fault 406. The substation IED 404 can further use this information to verify that it calculated the correct phase with the fault 406.

Figure 5:
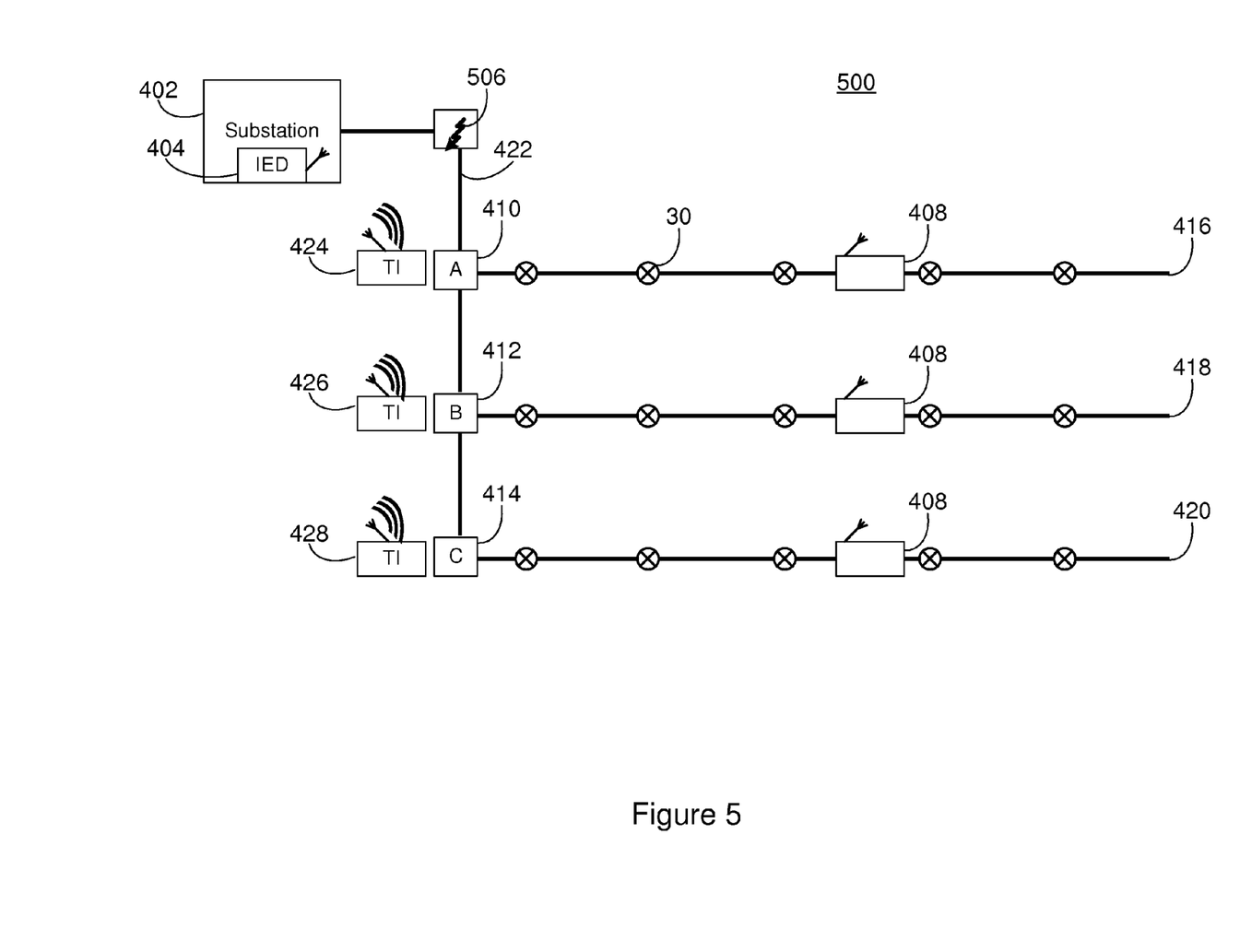
FIG. 5 is a line diagram of a power system using the present disclosure.

Illustrated in FIG. 5 is another example where the power system 500 may experience a fault 506 at the bus 422. The fault 506 may disrupt voltage and/or current in the lines 416, 418, and 420, and cause the FCIs 30 on the lines to experience a possible event such as a loss of potential. The TIs 424, 426, and 428 may include algorithms allowing for a calculation of the direction to the fault 506. When the TIs 424, 426, and 428 calculates that the fault 506 happened at a point upstream from their respective feeder lines, the TIs 424, 426, and 428 may signal the FCIs 30 on their respective lines to not report the event.

The FCIs 30 of the embodiments described herein may be programmed to signal the presence of a fault back to their respective TIs 424, 426, or 428 after a predetermined time period in a case that the TI 424, 426, or 428 fails to signal the FCIs 30 not to report the event. For example, in FIG. 6 a power system 600 is illustrated. FCI 636 experiences a loss of potential downstream from an IED 408 (such as a recloser control). TI 424 does not experience a fault, and so does not interrogate the FCIs 30. After a predetermined time (such as, for example, 5 minutes), the FCI 636 signals to the TI 424 that it has experienced the loss of potential. The TI 424 can then use this information in its typical protection algorithms, and/or communicate the message to the monitoring system and/or the substation IED 404. In this example, the loss of potential may be due to a high-impedance fault (e.g. downed conductor). The TI and/or a relay at the substation may be operating a high-impedance fault detection algorithm such as Arc Sense™ Technology (available from Schweitzer Engineering Laboratories, Inc., Pullman, Wash., and described in US Patent Application Publications 2008/0030199 and 2008/0031520) configured to detect the high-impedance fault. The TI and/or relay at the substation may work in conjunction with the FCIs as described to relate the loss-of-potential detection with the detection of a high-impedance fault.

Figure 6:
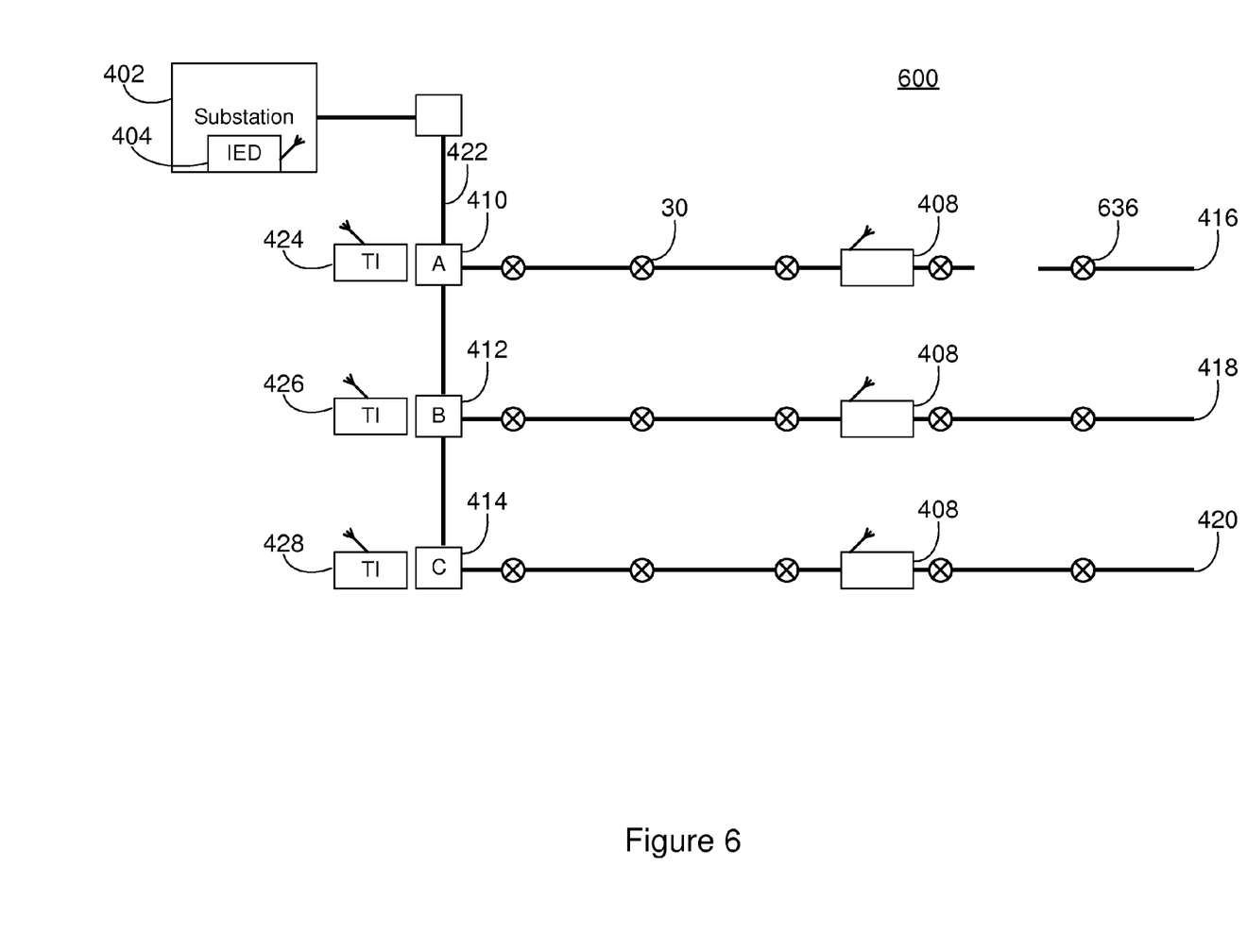
FIG. 6 is a line diagram of a power system using the present disclosure.

The FCIs 30 of the present disclosure may be capable of storing event data. They may further be capable of time-stamping the event data as described above with a "time since event" or a common time. In this way the TI can better use the event data.

The FCIs may further be capable of storing and time stamping multiple events. For example, if the line experienced a fault and a recloser on the line attempted to reclose the line several times, the FCI would experience several loss-of-potential, overcurrent, inrush, and/or fault events. When later interrogated, the FCI can report each event with a time stamp, and the TI can use or transmit the event information.

Figure 7:
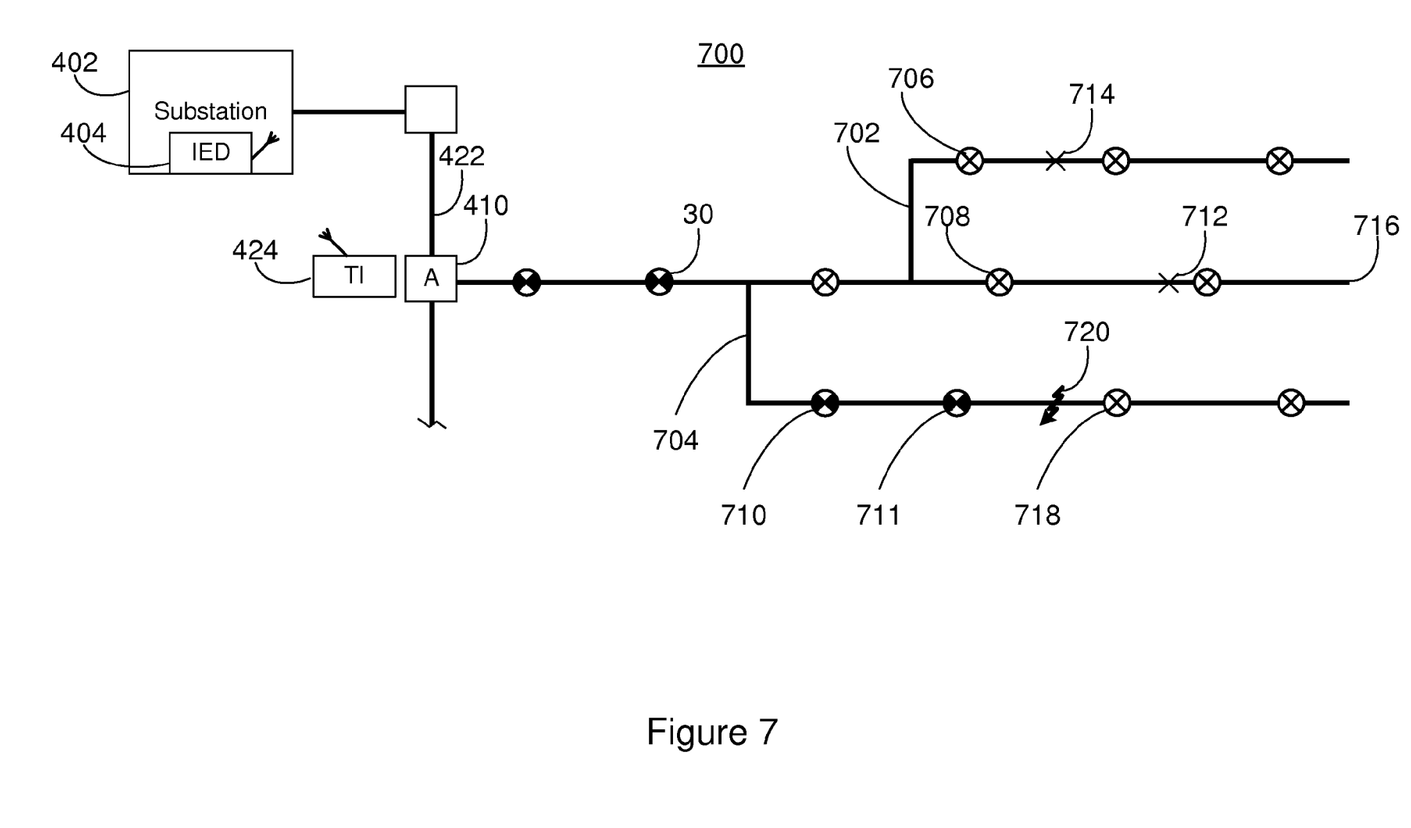
FIG. 7 is a line diagram of a power system using the present disclosure.

As mentioned herein, the present disclosure may be used on electric power systems that include branches off of a feeder. One such embodiment is illustrated in FIG. 7, where an electric power system 700 with a TI 424 acting as or operating on an IED for protecting a feeder 716 that includes a first branch 702 and a second branch 704. The feeder 716 and branches 702 and 704 include several FCIs 30 as described herein. According to this embodiment, a fault 706 has occurred on the second branch 704. TI 424 includes logic allowing it to calculate a distance to the fault. However, because the feeder 716 includes two branches, a distance to the fault results in three possible locations: one location 714 on the first branch 702; a second location 712 on the feeder 716; and, a third location at the fault 720 on the second branch 704. Accordingly, to determine the location of the fault, the IED will rely on the FCIs 30.

As with other embodiments described herein, the IED can interrogate FCIs it suspects to be the FCI immediately before the fault. Accordingly, IED will interrogate FCIs 706, 708, and 711. When FCIs 706 and 708 report no fault detection, and FCI 711 does report the fault 720, then the IED can determine that the fault 706 is on the second branch 704. To confirm the distance to the fault, the TI 424 may interrogate FCI 718 as described above. To facilitate the IED in determining which FCIs 30 are on which branch or feeder, each FCI may include its FCI identification information as described above in its status message back to the TI 424. With this information, the TI, substation IED, and/or the monitoring system can determine which feeder or branch is associated with the FCI, and its location on the feeder or branch. Accordingly, in the embodiment described above, after interrogation of the FCIs 706, 708, and 711, the TI can report the distance to the fault, and the branch (or feeder) on which the fault occurred.

Alternatively, the IED may be configured to interrogate the first FCI on each branch to determine which is the faulted branch when its distance calculation algorithms indicate that the fault is present on one of several branches. Here, the FCI would interrogate FCIs 706, 708, and 710, with only 710 reporting a fault. The IED could then conclude that the fault is located on branch 704, and either continue to interrogate FCIs on that branch to determine fault location, and/or use its distance calculation algorithms to determine the location of the fault on branch 704.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. A system for providing power system information to a monitoring scheme, comprising:
    a monitoring scheme associated with an electric power system;
    a first device comprising a faulted circuit indicator associated with the electric power system, comprising:
        an acquisition circuit configured to monitor a power system condition;
        a processor in communication with the acquisition circuit configured to detect an adverse event on the electric power system based on the power system condition; and
        a radio transmitter in communication with the processor and configured to transmit a status message upon occurrence of a predetermined condition, wherein the status message comprises an indication of the adverse event;
    a transceiver interface associated with the electric power system, including:
        a radio receiver configured to receive the status message from the first device;
        a logic module in communication with the radio receiver, configured to receive the status message from the first device and a status message from a second device associated with the electric power system, and verify the adverse event using power system information received from the first device and the second device and only upon verification communicate the status message to a transceiver; and
    wherein the transceiver is in communication with the logic module and configured to transmit the status message to the monitoring scheme.

2. The system of claim 1 wherein the second device comprises the transceiver interface, which further comprises an acquisition circuit for acquiring power system data from the electric power system.

3. The system of claim 2, wherein the logic module is configured to compare the status message against power system data acquired by the acquisition circuit.

4. The system of claim 3, wherein the adverse event comprises a fault on the electric power system and the data acquired by the acquisition circuit comprises status of an interrupting device on the electric power system.

5. The system of claim 3, wherein the adverse event comprises a fault on the electric power system and the data acquired by the acquisition circuit comprises status of a contact of an intelligent electronic device.

6. The system of claim 3, wherein the adverse event comprises a fault on the electric power system and the data acquired by the acquisition circuit comprises a digital signal.

7. The system of claim 3, wherein the logic module is further configured to interrogate the faulted circuit indicator for a status message, and the event comprises an interrogation command from the transceiver interface.

8. The system of claim 1, wherein the adverse event comprises one selected from the group consisting of: a fault on the electric power system, detection of load above a threshold for a determined amount of time, a temporary fault, a permanent fault, loss of potential, a switching transient, a system overload, and exceeded load profile, and combinations thereof.

9. The system of claim 5, wherein the status of the contact comprises one selected from the group consisting of a protective element pickup, a trip signal, an overcurrent element pickup, an undervoltage element pickup, a power swing pickup, a ground fault element pickup, a ground overcurrent element pickup, and combinations thereof.

10. The system of claim 3, wherein the logic module is further configured to only communicate the status message to the monitoring scheme if the adverse event correlates with the data acquired by the acquisition circuit.

11. The system of claim 10, wherein the transceiver interface further comprises a memory in communication with the logic module, and the logic module is further configured to write the status message to memory.

12. The system of claim 3, wherein the logic module is further configured to communicate the status message on a low priority basis to the transceiver if the adverse event does not correlate with the data acquired by the acquisition circuit.

13. The system of claim 2, wherein the acquisition circuit comprises a communications circuit in communication with the second device comprising an intelligent electronic device connected to the electric power system.

14. The system of claim 2, wherein the acquisition circuit comprises a communications circuit in communication with equipment installed on the electric power system.

15. The system of claim 14, wherein the equipment comprises an interrupting device.

16. The system of claim 1, wherein the adverse event comprises one selected from the group consisting of: an overcurrent condition, an undervoltage condition, an overtemperature condition, a fault condition, and combinations thereof.

17. The system of claim 1, wherein the faulted circuit indicator further comprises a temperature-sensing module configured to sense a temperature associated with the faulted circuit indicator.

18. The system of claim 1, wherein the faulted circuit indicator further comprises a temperature-sensing module configured to sense a temperature associated with the electric power system.

19. The system of claim 1, wherein the predetermined condition comprises detection of the adverse event.

20. The system of claim 1, wherein the status message further comprises faulted circuit indicator location information.

21. The system of claim 20, wherein the location information comprises GPS coordinates.

22. The system of claim 20, wherein the location information comprises a serial number of the faulted circuit indicator.

23. The system of claim 20, wherein the location information comprises a pole number.

24. The system of claim 1, wherein the status message further comprises fault history information from the faulted circuit indicator.

25. The system of claim 1, wherein the faulted circuit indicator further comprises a clock in communication with the processor, and the predetermined condition comprises a lapse of a predetermined time interval.

26. The system of claim 1, wherein the transceiver interface comprises a separate component of the system.

27. The system of claim 1, further comprising an intelligent electronic device in communication with the monitoring scheme and configured to acquire power system information, and comprising the transceiver interface.

28. The system of claim 1, wherein the monitoring scheme comprises one selected from the group consisting of: a supervisory control and data acquisition (SCADA) system, an outage management system, an automatic meter reading (AMR) system, an advanced metering infrastructure (AMI) system, a communications system, and combinations thereof.

29. The system of claim 1, wherein:
the faulted circuit indicator further comprises a clock in communication with the processor;
the processor is configured to record a time between the detection of the adverse event and receipt of an interrogation from the transceiver interface, and to write the time into the status message.

30. A transceiver interface for receiving a status message from a first device comprising a faulted circuit indicator monitoring an electric power system, processing the status message, and transmitting the status message to a supervisory control and data acquisition scheme, comprising:
a radio receiver configured to receive the status message from the faulted circuit indicator, wherein the status message comprises an indication of a fault on the electric power system;
a logic module configured to:
verify the fault using other power system information received from a second device associated with the electric power system, wherein verifying the fault comprises determining whether the second device detected the fault and
communicate the status message to a transceiver only upon verification of the status message; and
a transceiver in communication with the logic module and configured to transmit the status message to the supervisory control and data acquisition scheme.

31. The transceiver interface of claim 30, further comprising a communications port in communication with the logic module, and configured to receive the other power system information from the second device comprising an intelligent electronic device.

32. The transceiver interface of claim 30, further comprising a communications port in communication with the logic module, and configured to receive the other power system information from the second device comprising power system equipment on the electric power system.

33. The transceiver interface of claim 30, further comprising a radio transmitter in communication with the logic module, and wherein the logic module is configured to cause the radio transmitter to send an interrogation message to the faulted circuit indicator causing the faulted circuit indicator to transmit the status message.

34. The transceiver interface of claim 30, wherein the logic module is further comprised to communicate the status message to the transceiver only if the status message correlates with the other power system information.

35. A method for filtering status messages from a faulted circuit indicator in communication with an electric power system and to a receiver interface in communication with a monitoring system, the method comprising the steps of:
detecting an adverse power system event by the faulted circuit indicator;
transmitting a status message to the transceiver interface, wherein the status message comprises an indication of the adverse power system event;
receiving power system information by the transceiver interface;
verifying the adverse power system event using power system information received from a second device associated with the electric power system; and
transmitting the status message to the monitoring system only upon verification of the status message.

36. The method of claim 35, wherein the step of detecting an adverse power system event comprises one selected from the group consisting of: detecting a fault on the electric power system;
detecting a permanent fault on the electric power system; detecting a temporary fault on the electric power system; detecting an overcurrent condition; detecting an undervoltage condition; detecting an elevated temperature condition; detecting a passage of a predetermined amount of time; and combinations thereof.

37. The method of claim 35, wherein the step of transmitting the status message comprises transmitting location information of the faulted circuit indicator.

38. The method of claim 37, wherein the step of transmitting the location information comprises transmitting GPS coordinates of the faulted circuit indicator.

39. The method of claim 37, wherein the step of transmitting the location information comprises transmitting a serial number of the faulted circuit indicator.

40. The method of claim 37, wherein the step of transmitting the location information comprises transmitting a pole number.

41. The method of claim 35, wherein the step of verifying comprises comparing the adverse power system event against a status of an interrupting device on the electric power system.

42. The method of claim 35, wherein the step of verifying comprises comparing the adverse power system event against a status of an intelligent electronic device contact.

43. A method for reducing an amount of communication from faulted circuit indicators to a monitoring system of an electric power system including a transceiver interface for filtering status messages from the faulted circuit indicators in communication with an electric power system and sending electric power system information to the monitoring system, the method comprising the steps of:
detecting an inimical power system event by the faulted circuit indicator;
transmitting a status message to the transceiver interface, wherein the status message comprises an indication of the inimical power system event;
receiving power system information by the transceiver interface;

verifying the inimical power system event using power system information received from a second device associated with the electric power system; and transmitting the status message to the monitoring system only upon verification of the status message.

* * * * *